United States Patent
Choi

[19]

[11] Patent Number: 5,952,867
[45] Date of Patent: Sep. 14, 1999

[54] EXPONENTIATOR CIRCUIT AND METHOD FOR GENERATING DECIBEL STEPS OF PROGRAMMABLE CURRENT GAIN

[75] Inventor: Davy H. Choi, Garland, Tex.

[73] Assignee: Texas Instruments Incorporated, Dallas, Tex.

[21] Appl. No.: 08/971,531

[22] Filed: Nov. 17, 1997

Related U.S. Application Data

[60] Provisional application No. 60/031,812, Nov. 26, 1996.

[51] Int. Cl.⁶ .................................................. H03G 11/08
[52] U.S. Cl. ........................................... 327/346; 327/352
[58] Field of Search ................................... 327/346, 347, 327/349, 350, 352, 560–563

[56] References Cited

U.S. PATENT DOCUMENTS

| | | | |
|---|---|---|---|
| 3,793,480 | 2/1974 | Waehner | 327/346 |
| 4,876,499 | 10/1989 | Anderson et al. | 327/350 |
| 5,162,678 | 11/1992 | Yamasaki | 327/346 |
| 5,461,337 | 10/1995 | Choi | 327/346 |
| 5,471,132 | 11/1995 | Ryat | 327/350 |
| 5,714,902 | 2/1998 | Comer | 327/346 |

*Primary Examiner*—Toan Tran
*Attorney, Agent, or Firm*—W. Daniel Swayze, Jr.; Wade James Brady, III; Richard L. Donaldson

[57] ABSTRACT

An exponentiator circuit (24) is provided that includes a first transistor device, that includes a BJT (80) and a BJT (84) configured in a Darlington configuration, and a second transistor device that includes a BJT (88) and a BJT (92) also configured in a Darlington configuration. The first transistor device is coupled between a reference voltage and a summing node, while the second transistor device is coupled between an output node and a summing node. A programmable current iI is provided to the first transistor device and the second transistor device such that the base-to-emitter voltages of the two devices are provided at a different level. This results in the generation of a first current through the first transistor device and an output current through the second transistor device. An input current is provided at the summing node which is equivalent to the sum of the first current and the output current. The overall gain of the exponentiator circuit (24) is approximately exponential. The exponentiator circuit (24) may have its overall gain varied based on the value of the programmable current iI.

11 Claims, 3 Drawing Sheets

EXPONENTIATOR CIRCUIT AND METHOD FOR GENERATING DECIBEL STEPS OF PROGRAMMABLE CURRENT GAIN

This application claims priority under 35 U.S.C. § 119 (e)(1) of provisional application No. 60/031,812, filed Nov. 26, 1996.

TECHNICAL FIELD OF THE INVENTION

This invention relates generally to the field of electronic circuitry and more particularly to an exponentiator circuit and method for generating decibel steps of programmable current gain that are constant or about constant.

BACKGROUND OF THE INVENTION

Classical gain control circuitry includes such circuitry as a standard Gilbert gain cell. A Gilbert gain cell or multiplier is generally composed of a transistor pair gain stage for generating an output current and a predistorted stage for controlling the transistor pair gain stage. By controlling the ratio of the input currents in the predistorted stage, the output current may be programmably controlled. A Gilbert gain cell will generally include at least two transistor pairs. However, a standard Gilbert gain cell does not provide exponential current gain control which is often desirable and needed.

Various circuit applications require exponential current gain control. For example, exponentially controlled amplifiers, such as transconductance amplifiers, require exponential or nearly exponential current control to provide exponential current gain. Other circuitry, such as low pass filters with tunable boost or gain, may also need exponential current control to provide exponential current gain.

Implementing exponential current gain is equivalent to implementing constant-decibel current gain steps. However, existing methods and circuitry suffer serious drawbacks and problems. Generally, existing methods and circuitry are silicon or "area inefficient," "offset prone," and often inaccurate. Offset prone refers to the added requirement and burden of ensuring that transistor pairs are properly matched and biased for correct circuitry operation. Overall system accuracy suffers if transistor pairs are not properly matched. Overall system reliability may also suffer due to improper transistor pair matching. Additionally, improper transistor pair matching increases overall system noise.

One method for providing exponential or nearly exponential current gain control involves the use of a resistor network in combination with a standard Gilbert gain cell to control the input currents in the predistorted stage. The resistor network is provided with a plurality of resistors that may be programmably selected to produce the desired ratio of input currents in the predistorted stage. This method not only suffers from the problems and disadvantages listed above but also suffers from circuitry design complexity. The circuitry design complexity is primarily caused by the need to design resistor values for every possible or desired combination of programmable inputs to the resistor network that will result in a ratio of input currents that generate the desired output current.

Another method for providing exponential or nearly exponential current gain control involves the use of an exponential current generator in combination with a standard Gilbert gain cell to control the input currents in the predistorted stage. The exponential current generator includes a voltage input that establishes one of the input currents at a fixed value and generates the other input current as an exponential or nearly exponential input current. The exponential current generator is a programmable generator that includes at least one transistor pair that must be matched during fabrication. In addition to the transistor pair in the exponential current generator, the standard Gilbert gain cell includes at least two additional transistor pairs for a total of at least three transistor pairs that must be matched. Therefore, this method also suffers from the disadvantages first mentioned above and is especially offset prone due to the requirement of transistor pair matching.

SUMMARY OF THE INVENTION

From the foregoing it may be appreciated that a need has arisen for an exponentiator circuit and method for generating decibel steps of programmable current gain that are constant or about constant to provide an approximately exponential current gain control that eliminate or reduce the problems of prior techniques. These problems include transistor pair matching, silicon area inefficiencies, circuitry design complexity, noise, and reliability. In accordance with the present invention, a circuitry and method for generating decibel steps of programmable current gain are provided which substantially eliminate the disadvantages and problems outlined above.

According to an embodiment of the present invention, an exponentiator circuit for generating decibel steps of programmable current gain that are constant or about constant is provided. The exponentiator circuit receives an input current, a first programmable input signal, and a second programmable input signal and generates an output current in response. The input current and the output current are approximately exponentially related. The exponentiator circuit includes a first transistor device coupled between a reference voltage and a summing node, and a second transistor device coupled between an output node and the summing node. The first transistor device receives a first programmable input signal and generates a first current that is provided to the summing node. The second transistor device receives a second programmable input signal and generates an output current that is also provided to the summing node. The sum of the first current and the output current is equivalent to the input current that is provided at the summing node.

The present invention provides various technical advantages. A technical advantage of the present invention includes a reduction or minimization in the number of transistor pairs. Another technical advantage of the present invention includes increased circuitry accuracy and reliability due to the reduction in transistor pairs and subsequent reduction in the likelihood that transistor pairs will not properly match or will fail. Still another technical advantage of the present invention includes increased circuitry fabrication yields because of the reduction in transistor pairs which reduces the chance of fabricating mismatched transistors. Yet another technical advantage of the present invention includes a reduction in overall silicon area as compared to prior methods using resistor networks. Still other technical advantages include reduced circuitry complexity and reduced noise. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
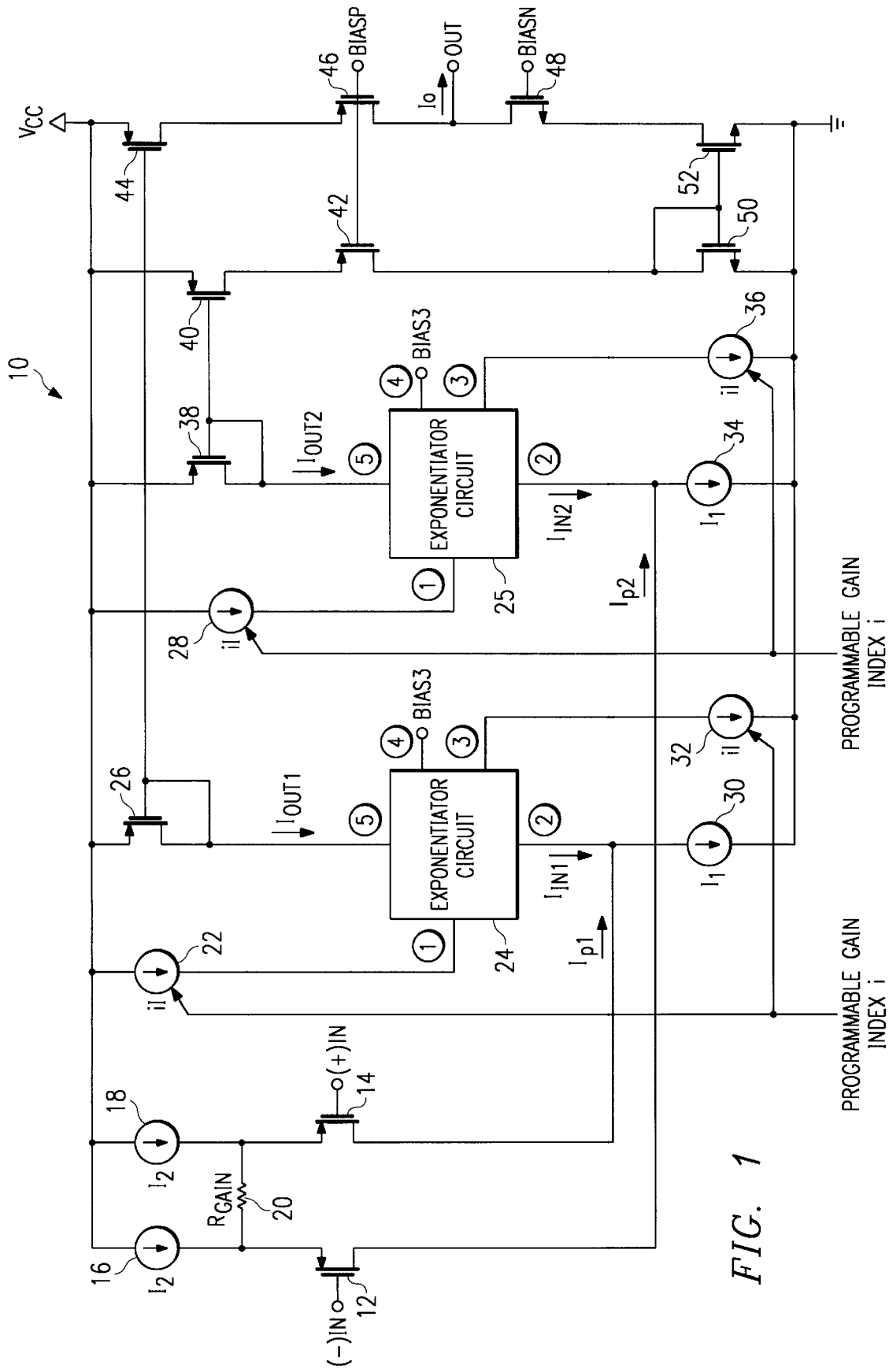
FIG. 1 is a circuit diagram illustrating a programmable transconductor using an exponentiator circuit.

FIG. 1 is a circuit diagram illustrating a programmable transconductor 10. Programmable transconductor 10 receives a differential input at an input field-effect transistor (FET) 12 and an input FET 14 and generates an output signal at an output node, labeled "OUT". The gain or transconductance of programmable transconductor 10 is equivalent to the equation shown below:

$$\frac{I_0}{V_{(+)IN} - V_{(-)IN}} = \frac{2(W/L)_{FET\,44}}{(R_{GAIN}(W/L))_{FET\,26}} \frac{1}{1+\exp\left(\frac{iIR}{2V_T}\right)}$$

where $V_{(+)IN}$ and $V_{(-)IN}$ are the voltages provided at the gate terminals of input FET 14 and input FET 12 respectively; W/L represents the ratio of the channel width to the channel length of a FET 44 and a FET 26; and the term ($iIR/2V_T$) is a term dependent upon an exponentiator circuit 24 and an exponentiator circuit 25, both of which receive a programmable current iI. As is illustrated in the above equation, the gain or transconductance of programmable transconductor 10 is provided as an approximately exponential response.

A first input signal is provided to input FET 14 so that a first input current $I_{p1}$ may be generated through input FET 14. A second input signal is provided to input FET 12 so that a second input current $I_{p2}$ may be generated through input FET 12. Because programmable transconductor 10 is a differential transconductor, it is desirable to maintain the two input currents in differential form as much as possible to increase the power supply rejection property of programmable transconductor 10. The desirability of maintaining the two input signals in differential form does not apply to the case when a single-ended output is required.

Figure 2:
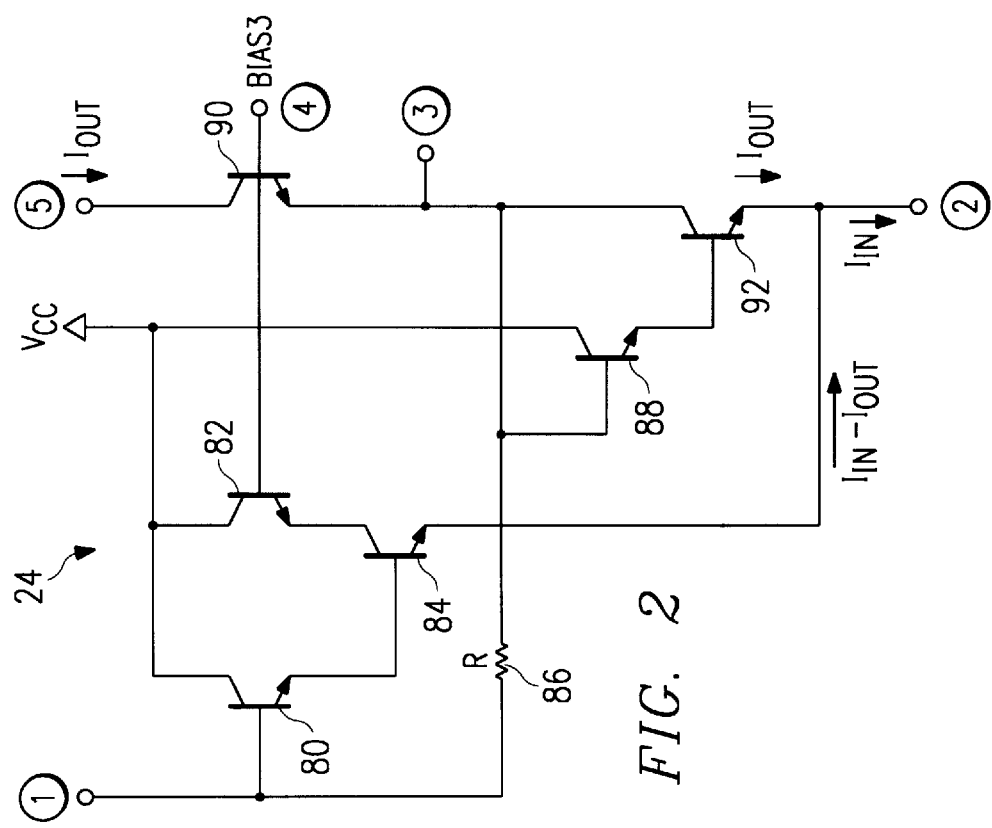
FIG. 2 is a circuit diagram illustrating the exponentiator circuit of the present invention.

Programmable transconductor 10 also includes exponentiator circuit 24 for processing the first input signal and exponentiator circuit 25 for processing the second input signal. Exponentiator circuit 24 is described more fully below and is illustrated in FIG. 2. Exponentiator circuit 25 performs the same functions as exponentiator circuit 24 and thus the description below and illustration of FIG. 2 will apply also to exponentiator circuit 25.

Input FET 14, which may be implemented as a p-channel metal-oxide field-effect transistor ("MOSFET"), receives the first input signal at its gate so that first input current $I_{p1}$ may be provided to node 2 of exponentiator 24. A fixed current source 18 provides a current to the source of input FET 14 which serves as a source of current to provide first input current $I_{p1}$. Input FET 12, which may also be implemented as a p-channel MOSFET, receives a second input signal at its gate so that a second input current $I_{p2}$ may be provided to node 2 of exponentiator 25. A fixed current source 16 provides a current to the source of input FET 12 which serves as a source of current to provide $I_{p2}$. A gain resistor 20 is provided between the sources of input FET 12 and input FET 14. Gain resistor 20 is a degeneration resistor of the input differential pair, including input FET 12 and input FET 14, such that the resistance value of gain resistor 20 is significantly greater than the source resistance of input FET 12 or input FET 14. The currents provided by fixed current source 18 and fixed current source 16 may be referred to as reference currents and they may be provided at the same value.

Exponentiator circuit 24 receives first input current $I_{p1}$ at node 2 and a programmable circuit iI at a node 1 and generates a corresponding output current $I_{OUT1}$ at a node 5 in response. The relationship between the first input current $I_{p1}$ and $I_{OUT1}$ is approximately an exponential relationship. Programmable current source 22 provides programmable current iI as determined or set by a programmable gain index i. The programmable gain index i may be provided from a memory storage device or may be provided externally from programmable transconductor 10.

Exponentiator circuit 25 receives a first input current $I_{p2}$ at a node 2 along with a programmable current iI at a node 1 and generates a corresponding output current $I_{OUT2}$ at a node 5. Just as in exponentiator circuit 24, the relationship between the second input current $I_{p2}$ and $I_{OUT2}$ is approximately an exponential relationship. Programmable current source 28 provides programmable current iI as determined by a programmable gain index i. The programmable gain index i may be provided from a memory storage device or may be provided externally from programmable transconductor 10. The programmable gain index i that is provided to programmable current source 22 and programmable current source 28 will generally be the same value so that the programmable current iI will be generated at the same value.

Exponentiator circuit 24 and exponentiator circuit 25 each provide a programmable current iI at a node 3 which is received by a corresponding programmable current sink. A programmable current sink 32 receives the programmable current iI from exponentiator circuit 24 that was originally provided by programmable current source 22, and similarly, programmable current sink 36 receives the programmable current iI from exponentiator circuit 25 that was originally provided by programmable current source 28. Programmable current sink 32 and programmable current sink 36 also receive the programmable gain index i. Exponentiator circuit 24 and exponentiator circuit 25 also include a node 4 for receiving a bias voltage.

Programmable current source 22 and programmable current source 28 include a digital-to-analog converter for receiving and converting the digital gain index i so that the programmable current iI may be generated. The desired gain index i may be stored or programmed into a memory device not shown in FIG. 1. For example, programmable current source 22 and programmable current source 28 may receive a binary or digital input signal that specifies the gain index i so that the programmable current iI may be generated according to the equation below:

$$i\,I = b_0 I + b_1 2I + b_2 4 I + \ldots + b_{N-1} 2^{N-1} I$$

where i is the gain index which is equal to the decimal equivalent of an N-bit binary word ($b_0, b_1, \ldots, b_{N-1}$). The values I, 2I, ..., $2^{(N-1)}$I refer to N branches of current that may be provided through the programmable current source. For example, N differential transistor pairs may direct these currents into a transistor, depending upon the logic states of ($b_0, b_1, \ldots, b_{N-1}$). The total transistor current may then be mirrored and configured in such a way that programmable current iI is available as a current source or a current sink. In this manner, programmable current source 22, programmable current source 28, programmable current sink 32, and programmable current sink 36 may be designed and developed to operate as discussed and as shown in FIG. 1.

Programmable current sink 32 couples between node 3 of exponentiator circuit 24 and ground, while programmable circuit sink 36 couples between node 3 of exponentiator circuit 25 and ground. These programmable current sinks are used to receive the programmable current iI as provided from their respective programmable current sources.

A current source 30 and a current source 34, both denoted with the symbol $I_1$, are fixed current sources and are coupled to node 2 of their respective exponentiator circuits. For example, current source 30 provides a fixed current that corresponds to the sum of the first input current $I_{p1}$ plus the current $I_{IN1}$ from node 2 of exponentiator current 24. Similarly, current source 34 provides a fixed current that is equal to the sum of the second input current $I_{p2}$ and the current $I_{IN2}$, which is provided from node 2 of exponentiator circuit 25. As illustrated in FIG. 1, both current source 30 and current source 34 are coupled to ground. Because the fixed current of current source 30 and current source 34 equals the sum of their respective input current $I_p$ plus the current $I_{IN}$ by varying the input current $I_p$ the current $I_{IN}$ must necessarily change. Thus, in effect, $I_{IN}$ serves as an input current.

The first output current $I_{OUT1}$, provided from node 5 of exponentiator circuit 24, is provided to an output mirror FET 26 which couples with a FET 44 to form a current mirror. Output mirror FET 26 is implemented, in the embodiment of FIG. 1, as a p-channel MOSFET with its gate and drain connected. $I_{OUT1}$ is mirrored from output mirror FET 26 to FET 44, which is also implemented as a p-channel MOSFET.

Similarly, second output current $I_{OUT2}$ is provided from node 5 of exponentiator circuit 25 to an output mirror FET 38. Output mirror FET 38 is similar to output mirror FET 26 and couples with a FET 40 to form a current mirror. $I_{OUT2}$ is mirrored from output mirror FET 38 to FET 40. $I_{OUT2}$ is then provided through a current mirror that includes a FET 50 and a FET 52. However, before $I_{OUT2}$ is provided to FET 50, $I_{OUT2}$ passes through a FET 42 which is controlled by a bias voltage at its gate. $I_{OUT2}$ is then provided to the output node after being provided through the channel of a FET 48 that is controlled at its gate by a bias voltage. FET 48 is implemented in FIG. 1 as an n-channel MOSFET.

Similarly, $I_{OUT1}$ is provided to the output node after being provided through a FET 46 which is controlled by a bias voltage at its gate. Thus, first output current $I_{OUT1}$ and second output current $I_{OUT2}$ are both provided to the output node of programmable transconductor 10 in opposite directions.

FET 46 and FET 48 are cascode devices which help to increase the output impedance of programmable transconductor 10. FET 42 is inserted as shown in FIG. 1 to match FET 46 so that FET 40 and FET 44 acquire similar drain-to-source voltages. This arrangement will result in better current mirror pairs of FET 26/FET 44 and FET 38/FET 40.

In operation, programmable transconductor 10 receives a first input signal at the gate of input FET 14 and a second input signal at the gate of input FET 12. The input signals may be provided as voltages. In response, exponentiator circuit 24 receives first input current $I_{p1}$ and generates first output current $I_{OUT1}$, and exponentiator circuit 25 receives second input current $I_{p2}$ and generates second output current $I_{OUT2}$. First output current $I_{OUT1}$ and first input current $I_{p1}$ have an approximately exponential relationship to one another. Similarly, second output current $I_{OUT2}$ and second input current $I_{p2}$ also have an approximately exponential relationship to one another. The gain of exponentiator circuit 24 and exponentiator current 25 is variable and is controlled through the programmable gain index i that serves as an input to programmable current source 22, programmable current source 28, programmable current sink 32, and programmable current sink 36. $I_{OUT1}$ and $I_{OUT2}$ are then provided, through a series of current mirrors and cascode devices, to the output node of programmable transconductor 10.

FIG. 2 is a circuit diagram illustrating exponentiator circuit 24 in more detail. The description and operation of exponentiator circuit 24 also applies to exponentiator circuit 25 of FIG. 1. Exponentiator circuit 24 will be described with reference to FIG. 1 and includes a first transistor device that is also configured in a Darlington configuration and a second transistor device that is configured in a Darlington configuration. The first transistor device includes a biopolar junction transistor ("BJT") 80 and a BJT 84, and the second transistor device includes a BJT 88 and a BJT 92.

Exponentiator circuit 24 receives an input current at node 2 and a programmable current iI at node 1 and generates an output current $I_{OUT}$ at node 5 in response. As previously discussed, current $I_{IN}$ may serve as an input current. A bias voltage is provided to the base terminals of a bias BJT 82 and a bias BJT 90 at node 4. Also, a node 3 is provided that serves as a current sink node so that the programmable current iI can be provided to current sink 32, as described above and as illustrated in FIG. 1. The relationship between output current $I_{OUT}$ and current $I_{IN}$ is given by the following equation:

$$\frac{I_{OUT}}{I_{IN}} = \frac{1}{1 + \exp\left(\frac{iIR}{2V_T}\right)}$$

where iI is the programmable current provided by programmable current source 22, R is the resistance of a resistor 86, and $V_T$ is the thermal voltage. It is desirable that the term $(iIR/V_T)$ of this equation be temperature and process invariant. This is accomplished my making:

$$I = \frac{V_{PTAT}}{R_{int}}$$

where $V_{PTAT}$ is proportional-to-absolute-temperature (PTAT) voltage which tracks out the temperature variation of $V_T$, and $R_{int}$ is an on-chip resistor which tracks out both temperature and process variations of R. As is illustrated in the equation above, $I_{OUT}$ is not an exact exponential function of $I_{IN}$. However, in most applications the output current does not have to be provided as an exact exponential function of the input current.

Resistor 86 couples between node 1 and node 3 and provides a path for the programmable current iI to flow from node 1 to node 3 which, in effect, is provided from programmable current source 22 to programmable current sink 32. As a consequence of this current flow, a voltage is established at node 1 which serves as the base voltage of BJT 80 and may be referred to as a first programmable signal. Similarly, a voltage is established at node 3 which serves as the base voltage of BJT 88 and may be referred to as a second programmable signal. Programmable current iI, after flowing through resistor 86, ensures that a different baseto-emitter voltage exists between the first transistor device and the second transistor device as between nodes 3 and 2.

The first transistor device, that includes the Darlington configuration of BJT 80 and BJT 84, generates a first current through BJT 84 that is equivalent to $I_{IN}-I_{OUT}$. The Darlington configuration of BJT 80 and BJT 84 reduces the base current effect of BJT 84 by a factor of about one-hundred thus making the base current closer to zero. Bias BJT 82 is provided to equalize the collector-to-emitter voltage of BJT 84 and BJT 92, thus minimizing the effect of the Early voltage.

The second transistor device, that includes the Darlington configuration of BJT 88 and BJT 92, generates an output current $I_{OUT}$ through BJT 92. The Darlington configuration of BJT 88 and BJT 92 reduces the base current effect of BJT 92 by a factor of about one-hundred thus making the base current closer to zero to improve overall performance. The Darlington configuration, in effect, operates as if it were a single transistor with an extremely high forward-current transfer ratio. Bias BJT 90 receive a bias voltage, denoted as "BIAS3" in FIG. 2, at its base terminal so that the current $I_{OUT}$ may flow through bias BJT 90 and BJT 92 in the direction indicated. Bias BJT 90 presents a high-impedance output at node 5, which serves as the output node for providing $I_{OUT}$. Bias BJT 90 also establishes biases for programmable current source 22 and programmable current sink 32.

In operation, programmable current source 22 provides a programmable current iI at node 1 which generally flows through resistor 86 and on to node 3 where it is then provided to programmable current sink 32. As a consequence, a different voltage is provided at the base terminal of BJT 80 and BJT 88. This results in a voltage being provided at the base terminal of BJT 84 and BJT 92, while a bias voltage is provided to bias BJT 82 and bias BJT 90. Input current $I_{IN}$ is provided at node 2, which may be referred to as a summing node. As a consequence, the output current $I_{OUT}$ is generated through BJT 92, and the first current is generated through BJT 84 which is equivalent to $I_{IN}-I_{OUT}$. $I_{OUT}$ is also provided through bias BJT 90 at output node 5 while the first current is provided through bias BJT 82 that is equivalent to $I_{IN}-I_{OUT}$.

The gain of exponentiator circuit 24, which is equivalent to $I_{OUT}/I_{IN}$, may be varied based on the programmable current iI, which is provided by programmable current source 22. As mentioned previously, programmable current source 22 is a programmable current source that includes a gain index i that may be varied or programmed as desired to change programmable current iI which changes the gain of exponentiator circuit 24. This is illustrated more fully in the graph of FIG. 3.

For most practical applications, a truly exponential gain is not a rigid requirement. However, although the gain must not be a truly exponential gain, the gain must be non-linear such that a reasonable constant amount of percentage gain change is achieved as the gain index i is incremented or decremented.

Figure 3:
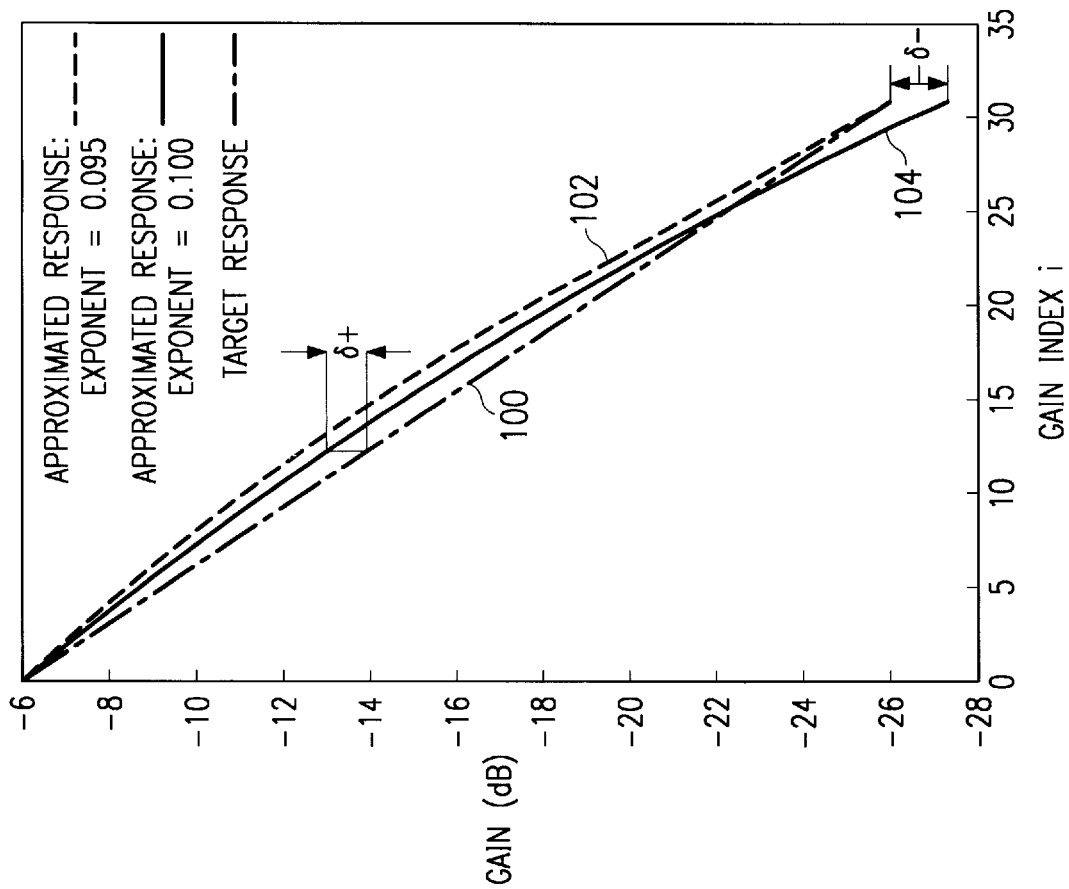
FIG. 3 is a graph illustrating a target exponential gain response compared to a first characteristic gain response and a second characteristic gain response that are provided by the exponentiator circuit.

FIG. 3 is a graph illustrating a target exponential gain response 100 as compared to a first characteristic gain response 102 and a second characteristic gain response 104 as provided by the exponentiator circuit 24. Once again, the gain equation defining the gain of exponentiator circuit 24 is given below:

$$\frac{I_{OUT}}{I_{IN}} = \frac{1}{1+\exp\left(\frac{iIR}{2V_T}\right)}$$

As is illustrated in the gain equation above, the gain of exponentiator circuit 24 is not a pure exponential response but is an approximated exponential response due to the presence of the constant that is added to the exponential function in the denominator of the gain equation. Target exponential gain response 100 is a true exponential response and thus is shown in FIG. 3 as a straight line. First characteristic gain response 102 reflects an approximated exponential gain response in which the term ($iIR/2V_T$) of the gain equation is equal to 0.095, and second characteristic gain response 104 reflects an approximated exponential gain response in which this term equals 0.100.

The y-axis of FIG. 3 reflects the gain $I_{OUT}/I_{IN}$, as measured in decibels, while the x-axis reflects the gain index i from 0 to 31. The gain index i is the programmable index or value that is provided to the programmable current source and sink, such as programmable current source 22 and programmable current sink 32 of FIG. 1. A pure exponential current gain is equivalent to providing constant-decibel current gain steps and would result in a straight line if plotted in the graph of FIG. 3. Target exponential gain response 100 illustrates such an example.

Target exponential gain response 100 illustrates an example of an exponentiator circuit with a pure exponential response, a 5-bit gain index, a maximum gain of −6 dB, and a full gain range of 20 dB. Target exponential gain response 100 is a straight line and proceeds from a gain of −6 dB when the gain index i is equal to zero to a gain of about −26 dB when the gain index i is equal to thirty-one. As is illustrated, first characteristic gain response 102 and second characteristic gain response 104 closely follow target exponential gain response 100 and will generally provide a satisfactory characteristic gain response.

Several observations can be made from the graph of FIG. 3. First characteristic gain response 102 provides a gain that is larger than or equal to target exponential gain response 100 for the same gain index i. A characteristic gain response with an exponent greater than 0.095 will include a range of gain indexes i in which the gain of the characteristic gain response is greater than the gain of target exponential gain response 100 and will also include a range of gain indexes i in which the gain of the characteristic gain response is less than the gain of target exponential gain response 100.

An optimum characteristic gain response can be found by minimizing the delta or difference between a particular characteristic gain response and a target exponential gain response, such as target exponential gain response 100, for all values of gain index i. For example, the optimum characteristic gain response for the exponentiator circuit illustrated in FIG. 3 would have an exponent equal to about 0.0993. As a result of programming programmable current source 22, a typical programmable current that may be generated is 5 microamps and a typical value of resistor 86 is 1.033 kiloohms.

Figure 4:
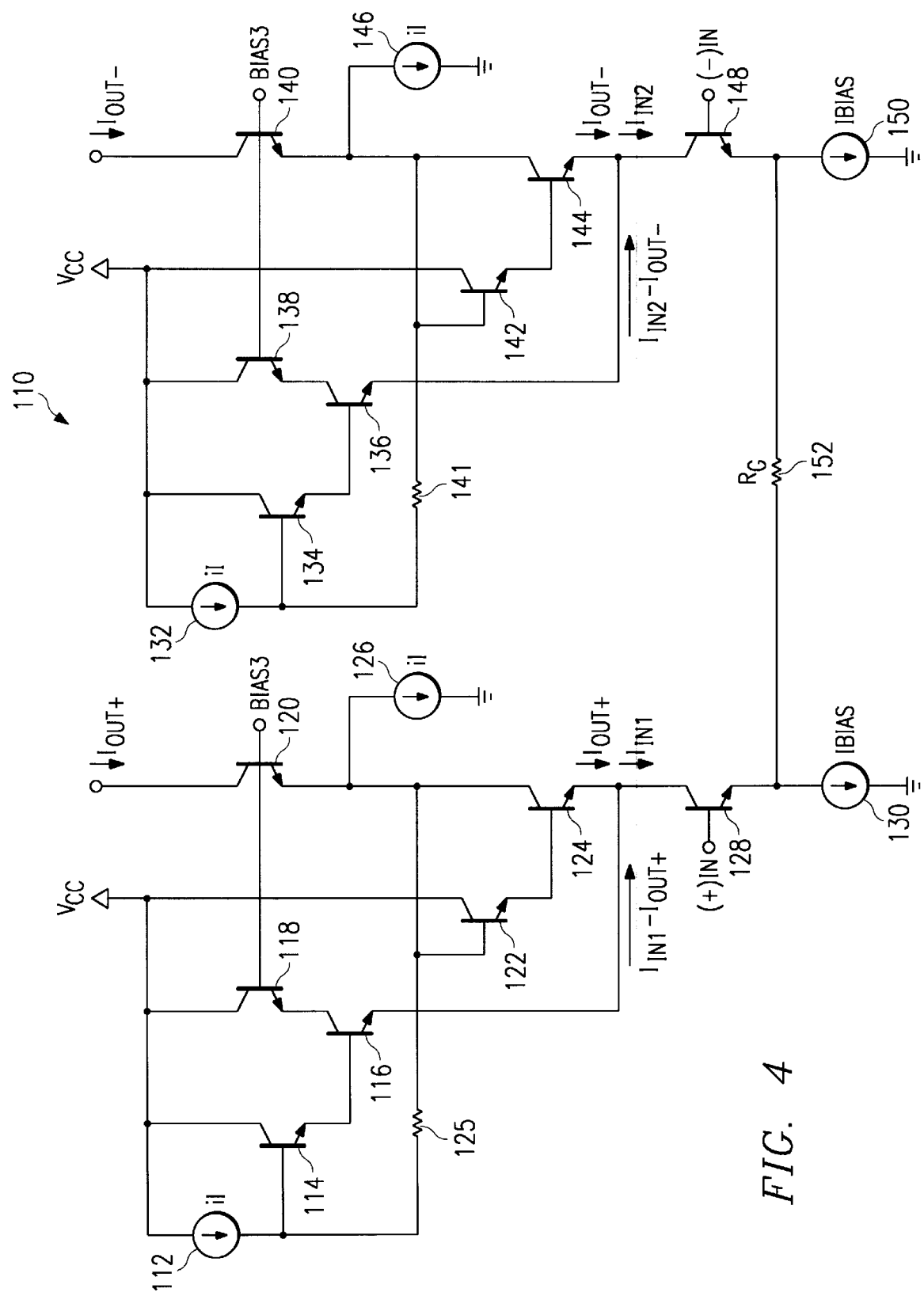
FIG. 4 is a circuit diagram illustrating another programmable transconductor using the exponentiator circuit.

FIG. 4 is a circuit diagram illustrating a programmable transconductor 110 according to the teachings of the present invention. Programmable transconductor 110 is a differential transconductor that receives differential input voltages and generates differential output currents in response.

Programmable transconductor 110 includes two exponentiator circuits. The first exponentiator circuit is shown on the left and includes a first input BJT 128 for receiving a first input voltage or signal at its gate. The second exponentiator circuit is shown on the right and includes a second input BJT 148 for receiving a second input voltage or signal at its gate. First input BJT 128 generates a first input current $I_{IN1}$ which flows through first input BJT 128 and out of the node in which the emitters of a BJT 116 and a BJT 124 couple. This node may be referred to as a summing node. Similarly, second input BJT 148 generate a second input current $I_{IN2}$ which flows out of summing node in which the emitters of a BJT 136 and a BJT 144 couple.

The first exponentiator circuit generates a first output current $I_{OUT+}$ which is provided through the collector of a bias BJT 120. The second exponentiator circuit generates a second output current $I_{OUT-}$ which is provided through the collector of a bias BJT 140 as shown in FIG. 4.

A current source 130 couples to the emitter of first input BJT 128 and provides a fixed bias current to ensure that current will flow from first input BJT 128. Similarly, a current source 150 couples to the emitter of second input BJT 148 and provides a fixed bias current to ensure that current will flow from second input BJT 148. The currents provided by current source 130 and current source 150 may be referred to as reference currents and they may be provided at the same value. A gain resistor 152 couples between the emitters of first input BJT 128 and second input BJT 148. The sum of first input current $I_{IN1}$ and second input current $I_{IN2}$ should always be equal to $2I_{BIAS}$. As a consequence, whenever the first input voltage is larger than the second input voltage, $I_{IN1}$ is greater than $I_{IN2}$ and a delta current will flow between the emitters of first input BJT 128 and second input BJT 148 through gain resistor 152. Conversely, whenever the second input signal is greater than the first input signal, second input current $I_{IN2}$ is greater than first input current $I_{IN1}$ and a delta current flows through gain resistor 152.

The first exponentiator circuit is similar to exponentiator circuit 24 of FIG. 2. The first exponentiator circuit includes a first transistor device configured as a Darlington configuration that includes a BJT 114 and BJT 116. The first exponentiator circuit also includes a second transistor device configured as a Darlington configuration that includes a BJT 122 and a BJT 124. A programmable current source 112, including a programmable gain index i as illustrated in FIG. 1, generates a programmable current iI which flows through a resistor 125 and then to a corresponding programmable current sink 126 where it is received. As a consequence of the programmable current iI flowing through resistor 125, a voltage drop is generated that is equivalent to the product of the resistance of resistor 125 and programmable current iI. This voltage drop ensures that the base-to-emitter voltage of the first transistor device, that includes BJT 114 and BJT 116, is different from the base-to-emitter voltage of the second transistor device, that includes BJT 122 and BJT 124. The voltage or signal applied to the first transistor device may be referred to as a first programmable signal. The voltage or signal that is provided to the second transistor device may be referred to as a second programmable signal. As a consequence, a different current will flow through BJT 124 as compared to the current that flows through BJT 116.

First output current $I_{OUT+}$ is generated through BJT 124 and a bias BJT 120. A first current that is equivalent to $I_{IN1}-I_{OUT+}$ is generated through BJT 116. Thus, the sum of the first current and the first output current corresponds to the first input current $I_{IN1}$. The first input current $I_{IN1}$ is provided at the summing node where the emitters of BJT 116 and BJT 124 couple.

Bias BJT 120 and a bias BJT 118 are also provided as part of the first exponentiator circuit. These bias BJTs are provided so that the output of the first exponentiator circuit presents a high-impedance output and also that the collector-to-emitter voltages of BJT 116 and BJT 124 are approximately equal so that the effect of the Early voltage is minimized.

Referring now to the second exponentiator circuit, the second exponentiator circuit is essentially identical to the first exponentiator circuit and functions according to the description just given for the first exponentiator circuit. The second exponentiator circuit includes first transistor device configured in a Darlington configuration that includes a BJT 134 and a BJT 136, and a second transistor device configured in a Darlington configuration that includes a BJT 142 and BJT 144. A programmable current source 132 generates a programmable current iI which is provided through a resistor 141 to a programmable current sink 146 where it is received. As a consequence, the base-to-emitter voltage of the first transistor device is different from the base-to-emitter voltage of the second transistor device. This results in a second output current $I_{OUT-}$ being generated through BJT 144 and a second current $I_{IN2}-I_{OUT-}$ being generated through BJT 136. The second output $I_{OUT-}$ and the second current $I_{IN2}-I_{OUT-}$ are provided at the summing node where the emitters of BJT 136 and BJT 144 couple. Thus, the sum of the second current and the second output current corresponds to the second input current $I_{IN2}$. The second input current $I_{IN2}$ is provided at the summing node as shown in FIG. 4.

A bias BJT 140 and a bias BJT 138 are also provided in the second exponentiator circuit as shown. These bias BJTs perform the same function as the bias BJTs described with respect to the first exponentiator circuit. Primarily, bias BJT 140 presents a high-impedance output for second output current $I_{OUT-}$ while bias BJT 138 is provided to equalize the collector-to-emitter voltages of BJT 136 and BJT 144 to ensure that an accurate second output current $I_{OUT-}$ is generated.

Both of the exponentiator circuits of programmable transconductor 110 provide an approximately exponential relationship between their respective input currents and output currents. The gain of each exponentiator circuit may be varied by changing gain index i of programmable current source 112, programmable current sink 126, programmable current source 132, and programmable current sink 146. The first output current $I_{OUT+}$ and the second output current $I_{OUT-}$ may be further processed by any desired circuitry, such as the output circuitry of FIG. 1.

Thus, it is apparent that there has been provided, in accordance with the present invention, an exponentiator circuit and method for generating decibel steps of programmable current gain that are constant or about constant that satisfy the advantages set forth above. Although the preferred embodiment has been described in detail, it should be understood that various changes, substitutions, and alterations can be made herein without departing from the scope of the present invention. For example, although implementations and embodiments of the present invention have been illustrated using both bipolar junction transistor and field effect transistor technology, the present invention is not limited to any one transistor technology, type, or combination. Also, the circuitry described and illustrated in the preferred embodiment as discrete or separate circuits may be combined into one circuit or split into separate circuits without departing from the scope of the present invention. Furthermore, the direct connections illustrated herein could be altered by one skilled in the art such that two devices are merely coupled to one another through an intermediate device or devices, without being directly connected, while still achieving the desired results demonstrated by the present invention. Other examples of changes, substitutions, and alterations are readily ascertainable by one skilled in the art and could be made without departing from the spirit and scope of the present invention as defined by the following claims.

What is claimed is:

1. An exponentiator circuit having an approximately exponential gain comprising:
   a first transistor device coupled between a reference voltage and a summing node, the first transistor device operable to receive a first programmable input signal and to generate a first current that is provided to the summing node; and
   a second transistor device coupled between an output node and the summing node, the second transistor device operable to receive a second programmable input signal and to generate an output current that is provided to the summing node and the output node, and wherein the sum of the first current and the output current are equivalent to an input current provided at the summing node, and the input current and the output current are approximately exponentially related.

2. The exponentiator circuit of claim 1, wherein the first programmable input signal and the second programmable input signal establish the gain of the exponentiator circuit and are both provided from a programmable current source, and the value of the first programmable input signal and the second programmable input signal are related through a resistor.

3. The exponentiator circuit of claim 1, wherein the first transistor device includes a plurality of transistors that are configured in a Darlington configuration.

4. The exponentiator circuit of claim 3, wherein the plurality of transistors of the first transistor device includes two transistors configured in a Darlington configuration.

5. The exponentiator circuit of claim 3, wherein the second transistor device includes a plurality of transistors that are configured in a Darlington configuration, and the plurality of transistors of the second transistor device includes two transistors configured in a Darlington configuration.

6. The exponentiator circuit of claim 1, wherein the first programmable input signal and the second programmable input signal are provided from a programmable current source that is controlled by a gain index, the programmable current source generates a programmable current that establishes the gain of the exponentiator circuit.

7. The exponentiator circuit of claim 6, wherein a programmable current sink receives the programmable current from the exponentiator circuit.

8. The exponentiator circuit of claim 6, wherein the gain of the exponentiator circuit varies with respect to the gain index in approximately an exponential relationship.

9. The exponentiator circuit of claim 1, wherein the first transistor device and the second transistor device include a bipolar junction transistor.

10. The exponentiator circuit of claim 1, further comprising:
    a first bias transistor coupled to the first transistor device and the reference voltage; and
    a second bias transistor coupled to the second transistor device and the output node.

11. The exponentiator circuit of claim 1, wherein the input current is provided at the summing node and a fixed current source provides a fixed current at the summing node.

* * * * *